(12) United States Patent
Gronlund et al.

(10) Patent No.: US 8,767,429 B2
(45) Date of Patent: *Jul. 1, 2014

(54) LOW POWER CONTENT-ADDRESSABLE MEMORY

(71) Applicant: Broadcom Corporation, Irvine, CA (US)

(72) Inventors: Christopher Gronlund, Kent, WA (US); Mark Winter, Seattle, WA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/901,970

(22) Filed: May 24, 2013

(65) Prior Publication Data

US 2013/0250642 A1 Sep. 26, 2013

Related U.S. Application Data

(63) Continuation of application No. 12/930,581, filed on Jan. 10, 2011, now Pat. No. 8,451,640.

(60) Provisional application No. 61/459,536, filed on Dec. 13, 2010.

(51) Int. Cl.
*G11C 15/00* (2006.01)
*G11C 15/04* (2006.01)
*G11C 5/02* (2006.01)

(52) U.S. Cl.
CPC ............... *G11C 15/04* (2013.01); *G11C 5/025* (2013.01); *G11C 15/00* (2013.01); *G11C 15/043* (2013.01)

USPC ............ 365/49.17; 365/49.1; 365/49.16

(58) Field of Classification Search
CPC ...... G11C 15/04; G11C 15/00; G11C 15/043; G11C 5/025
USPC .................. 365/49.17, 49.1, 49.16
See application file for complete search history.

(56) References Cited

U.S. PATENT DOCUMENTS

| | | | | |
|---|---|---|---|---|
| 7,561,454 B2* | 7/2009 | Perry et al. | ............ | 365/49.1 |
| 7,813,155 B1* | 10/2010 | Maheshwari | ............ | 365/49.17 |
| 7,952,901 B2* | 5/2011 | Chai et al. | ............ | 365/49.1 |
| 8,451,640 B2* | 5/2013 | Gronlund et al. | ............ | 365/49.17 |
| 8,576,599 B2* | 11/2013 | Atwal et al. | ............ | 365/49.1 |
| 8,582,338 B1* | 11/2013 | Argyres | ............ | 365/49.17 |

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A content addressable memory (CAM) system configured for reduced power consumption and increased speed includes a plurality of bit cells implementing a stacked architecture. Each bit cell comprises a pair of stacked storage elements in a first column and a compare circuit, coupled to the pair of stacked storage elements and a matchline of the CAM system, situated in a second column. The stacked architecture results in a reduced matchline length, thereby reducing CAM system power consumption and increasing CAM system speed. Further, a content addressable memory (CAM) system configured for reduced power consumption and increased speed includes storing encoded data in a pair of stacked storage elements.

19 Claims, 4 Drawing Sheets

LOW POWER CONTENT-ADDRESSABLE MEMORY

This is a continuation of application Ser. No. 12/930,581 filed Jan. 10, 2011, now U.S. Pat. No. 8,451,640, which itself claimed the benefit of and priority to a provisional patent application entitled "System for Reducing Power Consumption and Increasing Speed of Content-Addressable Memory," Ser. No. 61/459,536 filed on Dec. 13, 2010. The disclosure in that provisional application is hereby incorporated fully by reference into the present application.

BACKGROUND OF THE INVENTION

1. Field of the Invention

The present invention is generally in the field of memory systems and devices. More particularly, the present invention is in the field of content-addressable memory (CAM) systems and devices.

2. Background Art

Many computer-based technologies today rely on high speed access to data storage in order to produce highly interactive experiences for end users. In an environment where typical data sets are growing significantly larger, merely relying on larger designed bandwidths and higher bus and processor frequencies has diminishing returns. As a result, methods to reduce monolithic processor usage and data bus bandwidth requirements have been developed over time. One example method is the use of content-addressable memory (CAM) in order to speed up and offload search processes from conventional processors and data buses.

CAM is a type of memory that can take an input search word or series of bits, compare it against every entry within the CAM, and output a match location, all subject to a single clock cycle throughput. A generic CAM system may improve high speed processing in at least two ways: it can perform an exhaustive search very quickly, and it can reduce or eliminate a need to transfer large data sets to and from a memory array in order to perform a conventional search using, for example, a conventional monolithic processor. In the most basic case, where a data set is already resident in a CAM system and may be used for multiple searches, the only data bus bandwidth required is that used to designate the search word to the CAM system initially, and that used to return a search result.

However, as the relative speed of conventional monolithic processors and data buses increases over time, the benefits of conventional CAM systems risk becoming overshadowed by their extra dedicated space requirements as well as their additional power requirements. For instance, a major drawback of conventional CAM systems is that in order to provide their search results, the entire CAM array is typically powered and operational, which makes conventional CAM systems relatively expensive to use due to high power consumption and the on-chip space used to provide such power.

Thus, there is a need to overcome the drawbacks and deficiencies in the art by providing a compact and inexpensive architecture for reducing CAM system power consumption and increasing CAM system speed.

SUMMARY OF THE INVENTION

The present application is directed to a system for reducing power consumption and increasing speed of content-addressable memory, substantially as shown in and/or described in connection with at least one of the figures, as set forth more completely in the claims.

DETAILED DESCRIPTION OF THE INVENTION

Figure 1:
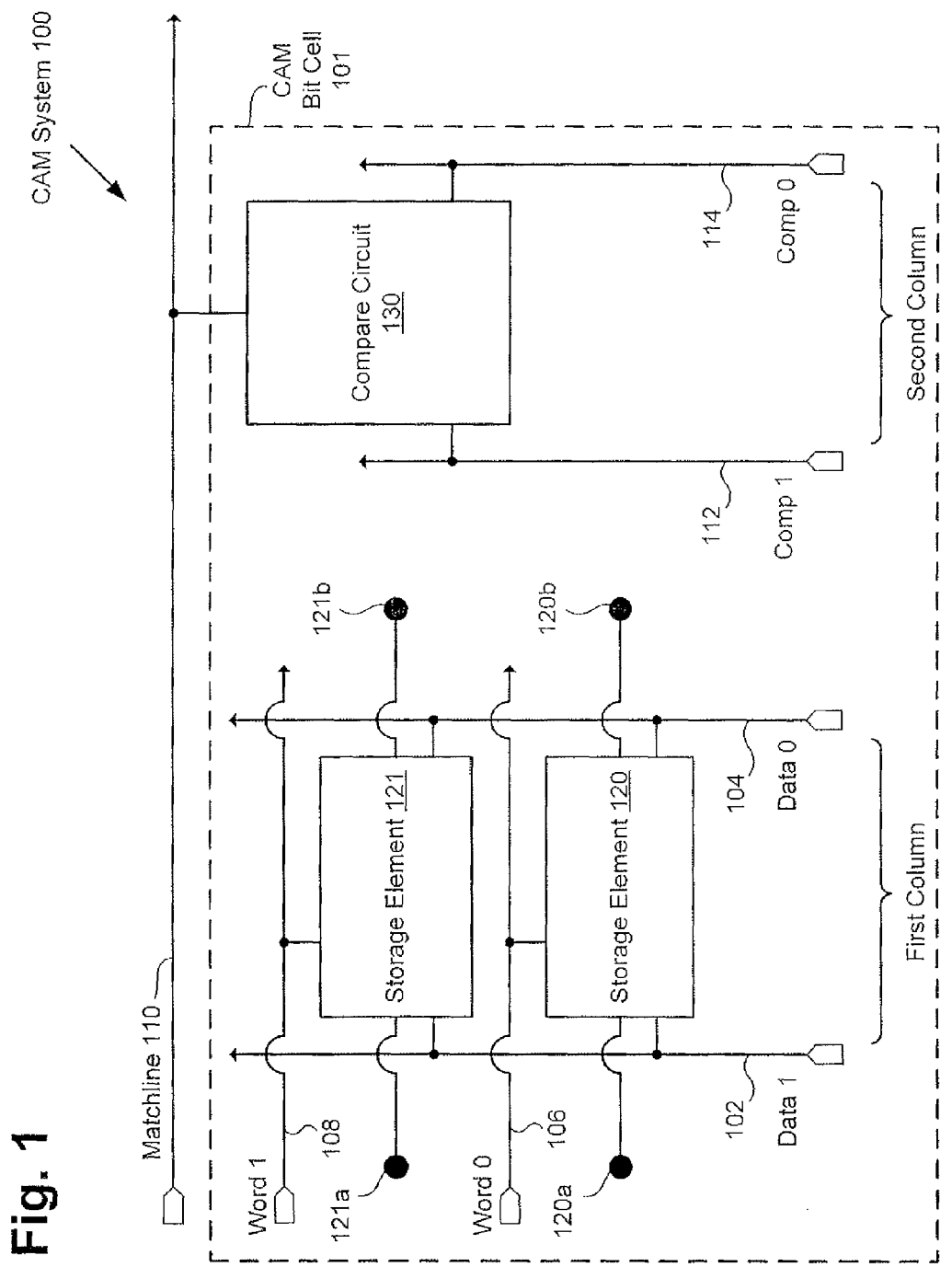
FIG. 1 illustrates an equivalent circuit schematic of a content-addressable memory (CAM) system, according to an embodiment of the present invention.

The present invention is directed to a system for reducing power consumption and increasing speed of content-addressable memory (CAM). The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. TO maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates an embodiment of the present invention that reduces power consumption and increases speed of a CAM system. As shown in FIG. 1, CAM system 100 includes CAM bit cell 101 and matchline 110. As further shown in FIG. 1, CAM bit cell 101 includes storage elements 120 and 121, and compare circuit 130. Also shown in FIG. 1 are bit lines 102 and 104, word lines 106 and 108, and compare lines 112 and 114, as well as nodes 120a, 120b, 121a, and 121b of respective storage elements 120 and 121. Nodes 120a, 120b, 121a and 121b signify access nodes to data stored in respective storage elements 120 and 121, and nodes 120a, 120b, 121a and 121b are referenced with respect to subsequent FIGS. 3 and 4 directed to more detailed embodiments of compare circuit 130, in order to illustrate connections to those nodes without explicitly drawing corresponding connecting traces. Other structures used to enable basic CAM functionality, such as a means to sense a match or mismatch state of matchline 110 or to pre-charge matchline 110 to a particular state, for example, have been left out of FIG. 1 in order not to obscure the invention, but such structures are well known to those skilled in the art.

CAM bit cell 101 of CAM system 100 is configured to store data, compare that data against a supplied comparison bit, and then apply a resulting match or mismatch state to matchline 110. Specifically, CAM bit cell 101 in FIG. 1 may be configured to use compare circuit 130 to compare two bits of data stored in a pair of storage elements 120 and 121 against a supplied comparison bit. Then, CAM bit cell 101 may be configured to apply a resulting match or mismatch state to matchline 110, again using compare circuit 130. For example, CAM system 100 may be configured so that a logic-high state on matchline 110 corresponds to a match state. Under such circumstances, matchline 110 may be correspondingly pre-charged to a logic-high state before each comparison if compare circuit 130 determines a mismatch state, compare circuit 130 may be configured to drive matchline 110 to a logic-low state, for example, which indicates a mismatch state to other circuitry connected to matchline 110 (not shown in FIG. 1). Correspondingly, if compare circuit 130 determines a match state, compare circuit 130 may be configured to apply the match state to matchline 110 by decoupling itself from matchline 110 in order not to disturb the pre-charged logic-high state.

Although not explicitly shown in FIG. 1, CAM system 100 may comprise any number of additional CAM bit cells similar to CAM bit cell 101, also attached to matchline 110, each applying a match or mismatch state to matchline 110, as described above. Thus, a full length of matchline 110 may be predominately dependent upon a corresponding length of CAM bit cell 101, especially where matchline 110 is coupled to a large number of CAM bit cells similar to CAM bit cell 101 that are situated in a row or rows running alongside matchline 110. Furthermore, CAM system 100 may comprise any number of additional matchlines similar to matchline 110 in order to form a CAM array, for example, as known in the art. Moreover, although CAM system 100 has been described in the context of a particular method for applying a match or mismatch state to matchline 110, such as a method including pre-charging matchline 110, for example, this context is not meant to limit the scope of the present inventive concepts. As such, in other embodiments of the present invention, a method for applying a match or mismatch state to matchline 110 may not include pre-charging matchline 110. For example, in other embodiments, a method for applying a match or mismatch state to matchline 110 may include voltage contention between one or more CAM bit cells and, for example, a pullup transistor.

As can be seen from FIG. 1, CAM bit cell 101 implements a stacked architecture where storage elements 120 and 121 may be arranged as a pair of stacked storage elements situated in a first column of CAM bit cell 101, and where compare circuit 130 may be situated in a second column immediately adjacent to or adjoining the first column of CAM bit cell 101, for example. By arranging storage elements 120 and 121 and compare circuit 130 in two adjoining columns, for example, a length of CAM bit cell 101 (e.g., measured horizontally along the length of matchline 110 in FIG. 1) may be significantly reduced, thereby also significantly reducing a length of matchline 110 relative to, for example, conventional CAM architectures.

The resistive and capacitive loads of a conductive trace like matchline 110 in a semiconductor device are typically directly related to the length of the conductive trace, and so a decrease in the length of matchline 110 decreases both the resistive and capacitive loads of matchline 110. The resistive and capacitive loads of a semiconductor structure are typically inversely related to the maximum switching frequency or speed supported by that structure, and so a low resistive and capacitive load is desirable for high speed functionality of a semiconductor device like a high speed CAM system. Similarly, because power consumption used to operate a semiconductor structure is often directly dependent on its resistive load, as well as increasingly dependent on its capacitive load as switching frequency increases, a low resistive load, and, in particular, a low capacitive load, are also desirable for low-power functionality of a high speed CAM system. For simplicity, the resistive and capacitive loads related to length are hereafter referred to jointly as the "metal" load.

By providing a stacked architecture configured to reduce a length of a coupled matchline, embodiments of the present inventive concepts advantageously reduce CAM system power consumption as compared to conventional CAM systems having the same number of storage elements coupled to conventionally longer matchlines, and, as explained above, this desirable comparative reduction of power consumption increases as system speed increases. Moreover, embodiments of the present inventive concepts also advantageously increase CAM system speed, or the maximum switching speed supported by a CAM system, as compared to conventional CAM systems. Thus, embodiments of the present inventive concepts provide significant performance advantages over conventional CAM systems using conventional CAM bit cell architectures.

The power and speed advantages noted above pertain to compare performance of CAM system 100, as matchline 110 is typically used only for compare processes. However, the stacking architecture of CAM bit cell 101 also has write performance advantages over conventional CAM bit cell architectures when data is written to storage elements 120 and 121. For example, lengths of word lines 106 and 108 servicing respective storage elements 120 and 121, as shown in FIG. 1, are decreased for much the same reasons that a length of matchline 110 is decreased, and so they also benefit from a reduced metal load, as explained above. Also, although FIG. 1 shows one word line each for storage elements 120 and 121, e.g., respective word lines 106 and 108, which is one more word line than is typically used in conventional CAM architectures, the presence of the additional word line may provide power consumption advantages, as is explained more fully below.

As can be seen in FIG. 1, stacking storage elements 120 and 121 facilitates sharing bit lines 102 and 104 between the pair of storage elements 120 and 121. Sharing of bit lines 102 and 104 by stacked storage elements 120 and 121 allows CAM bit cell 101 to be fabricated more compactly, which further reduces a length of CAM bit cell 101, with all the attendant benefits outlined above. Moreover, sharing of bit lines 102 and 104 allows storage elements 120 and 121 to share read/write logic used to power bit lines 102 and 104, which reduces the associated instantaneous power draw of such logic during write cycles, for example, approximately by half as compared to conventional, non-stacked CAM architectures. Thus, even though bit lines 102 and 104 are longer and see more source/drain connections than conventional non-shared bit lines servicing the same number of CAM bit cells, the reduction in number of bit lines as well as the associated logic results in a cumulative reduction in power consumption.

Moreover, while sharing of bit lines 102 and 104 may also mean that writing data to CAM bit cell 101 requires two write cycles instead of, for example, one write cycle where each storage element has its own pair of bit lines, the power required during each write cycle of CAM system 100 is less than that required if both storage elements were written to at the same time. For example, only one of word lines 106 and 108 need be powered during each write cycle, and, as explained above, sharing of bit lines 102 and 104 reduces a per-write cycle power draw, relative to conventional structures, by approximately half. Thus, an instantaneous or maximum write cycle power requirement for CAM system 100 is reduced, which may reduce fabrication costs associated with power supply circuitry and thermal sinking for CAM system 100, for example. However, while FIG. 1 shows storage elements 120 and 121 sharing bit lines 102 and 104, in other embodiments not shown in FIG. 1, storage elements 120 and 121 may each be coupled to their own pair of bit lines in order to, for example, increase write speed at the expense of write cycle power consumption and, possibly, a slightly lengthier bit cell.

While the stacking architecture of CAM bit cell 101 in FIG. 1 may advantageously decrease a length of matchline 110, it may also increase the lengths of bit lines 102 and 104 servicing storage elements 120 and 121 and compare lines 112 and 114 coupled to compare circuit 130. However, as explained above, the capability of sharing bit lines may compensate for some of the undesirable effects of adding length to bit lines 102 and 104 servicing storage elements 120 and 121. Moreover, CAM system power consumption and speed with respect to typical applications is mostly dependent on the power and time used to perform comparisons, since, generally, many comparisons are performed on each set of data written to a CAM system, and since the entire CAM system is typically active for each comparison. Thus, it is generally beneficial overall to trade off decreased write performance of a CAM system for increased comparison performance, both in terms of power consumption and speed. However, as will be explained more fully below, embodiments of the present inventive concepts may minimize any undesirable effects of increasing the height (as measured vertically, e.g., perpendicular to the length of matchline 110, in FIG. 1) of CAM bit cell 101.

Figure 2:
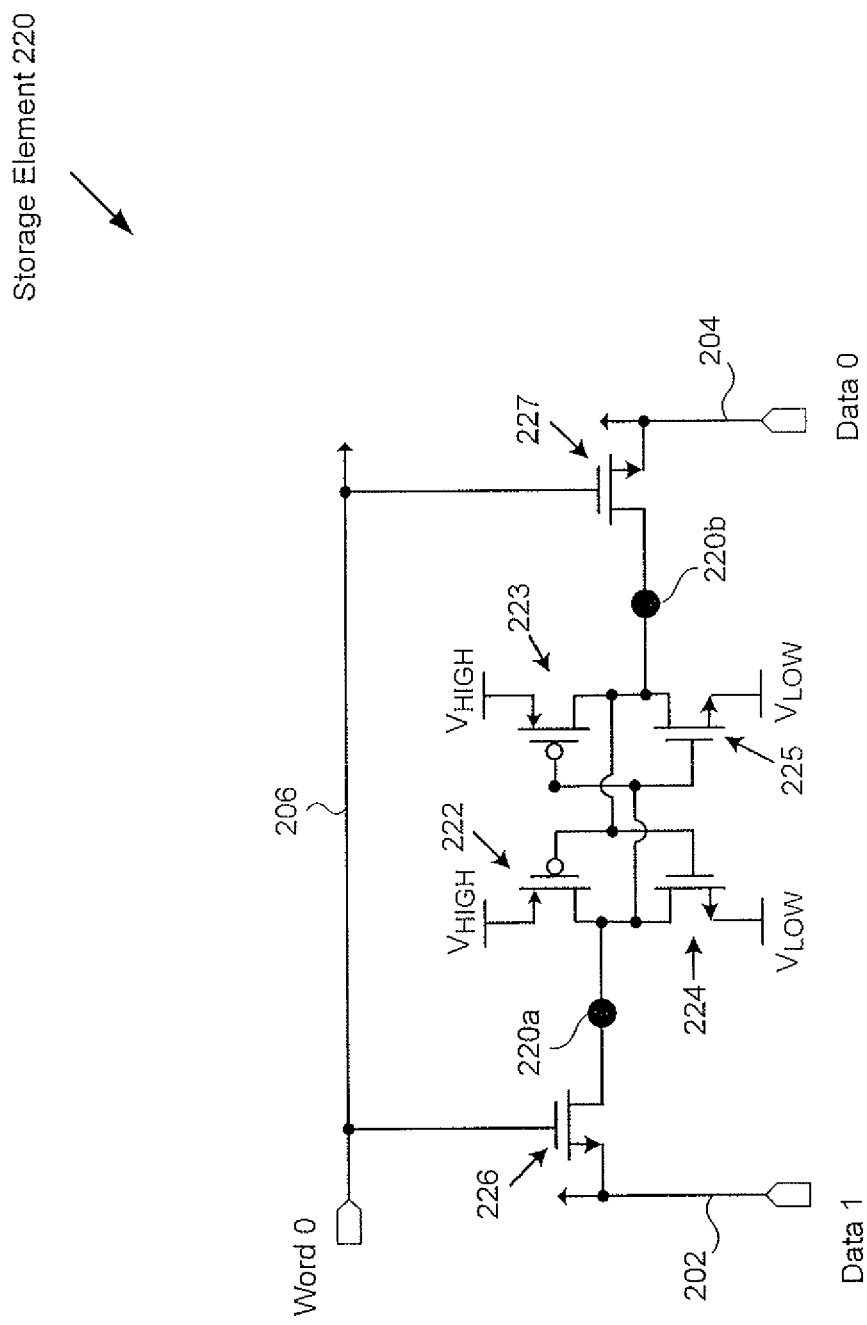
FIG. 2 illustrates an equivalent circuit schematic of a CAM storage element, according to an embodiment of the present invention.

Storage elements 120 and 121 of CAM bit cell 101 in FIG. 1 may comprise any semiconductor structure capable of storing data provided through use of, for example, word lines 106 and 108 and bit lines 102 and 104, as known in the art, and capable of allowing such stored data to be accessed by a compare circuit, such as compare circuit 130. FIG. 2 shows a more detailed example of such a storage element.

FIG. 2 illustrates an equivalent circuit schematic of storage element 220 suitable for use in a CAM system according to one embodiment of the present invention. As shown in FIG. 2, storage element 220 comprises two P type metal-oxide semiconductor (PMOS) transistors 222 and 223 and two N type MOS (NMOS) transistors 224 and 225 arranged in a conventional flip-flop configuration, and two additional NMOS access transistors 226 and 227 used to facilitate writing data to storage element 220. Also shown in FIG. 2 are bit lines 202 and 204, word line 206, and nodes 220a and 220b of storage element 220. Storage element 220 including nodes 220a and 220b, bit lines 202 and 204, and 204, and word line 206 correspond respectively to storage element 120 including nodes 120a and 120b, bit lines 102 and 104, and word line 106, in FIG. 1. In normal operation, node 220b may be the logic complement of node 220a. It is noted that a circuit correspondingly similar to that shown in FIG. 2 may also be used to implement storage element 121 of FIG. 1.

Although storage element 220 is shown as including a total of six transistors with two PMOS transistors, other embodiments of storage element 220 may have more or less total transistors, or more or less PMOS transistors. Furthermore, although FIG. 1 shows a particular orientation of storage element 220 with respect to a word line 206, bit lines 202 and 204, nodes 220a and 220b, and the positions of transistors 222, 223, 224, 225, 226, and 227, storage element 220 may be alternatively configured with respect to those structures in order to facilitate compact stacking with another storage element, such as storage element 121, in FIG. 1, where, for example, PMOS transistors of a pair of stacked storage elements all lie in a common area of a CAM bit cell.

Figure 3:
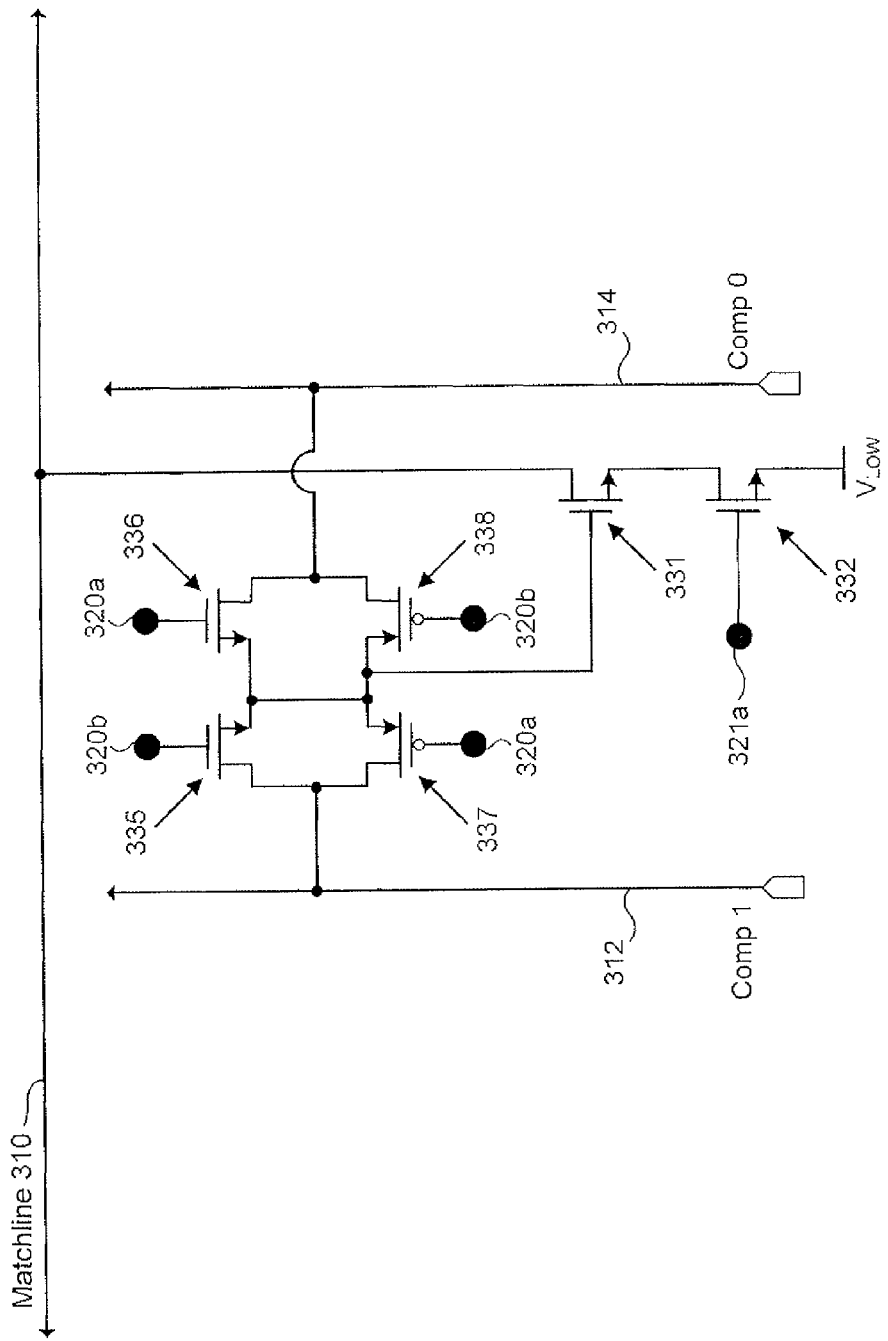
FIG. 3 illustrates an equivalent circuit schematic of a CAM compare circuit, according to an embodiment of the present invention.

Referring again to compare circuit 130 of CAM bit cell 101, in FIG. 1, compare circuit 130 may comprise any semiconductor structure capable of comparing compare-data provided over, for example, compare lines 112 and 114 as shown in FIG. 1, against stored data accessed through use of nodes of one or more storage elements. Compare circuit 130 may also be capable of applying a result of such comparison to matchline of a CAM system, such as matchline 110 of CAM system 100. FIG. 3 shows a more detailed example of such a compare circuit, according to one embodiment of the present invention.

FIG. 3 illustrates an equivalent circuit schematic of CAM compare circuit 330, according to an embodiment of the present invention. In FIG. 3, matchline 310, nodes 320a, 320b and 321a, compare lines 312 and 314, and compare circuit 330 correspond respectively to matchline 110, nodes 120a, 120b and 121a, compare lines 112 and 114, and compare circuit 130 of FIG. 1. As shown in FIG. 3, in one embodiment, compare circuit 330 may include two NMOS transistors 335 and 336 and two PMOS transistors 337 and 338 configured to compare compare-data provided on compare lines 312 and 314 against stored data accessed through nodes 320a and 320b. Compare circuit 330 may also include two further NMOS transistors, e.g., NMOS transistors 331 and 332, in a pulldown-stack configuration coupled to matchline 310. Those additional NMOS transistors 331 and 332 may be implemented so as to apply a match or mismatch state to matchline 310 depending on stored data accessed through node 321a.

For example, CAM bit cell 101 of FIG. 1 may be configured to be used as a ternary bit cell having storage element 120 assigned a data bit and storage element 121 assigned a mask bit, as known in the art. Compare circuit 330 may access a data bit stored in storage element 120 through, for example, nodes 320a and 320b, as shown in FIG. 3. If a data bit stored in storage element 120 matches the supplied compare-data, NMOS transistor 331 may decouple compare circuit 330 from matchline 310, regardless of the match bit stored in storage element 121, and thus apply a match state to matchline 310, as described above. If, instead, a mask bit is set in CAM bit cell 101 (e.g., a logic-low is stored in storage element 121 at node 121a), then NMOS transistor 332 may decouple compare circuit 330 from matchline 310, regardless of whether a data bit stored in storage element 120 matches supplied compare-data, and thus apply a match state to matchline 310. If a mask bit is not set and the supplied compare-data does not match, compare circuit 330 may drive matchline 310 logic-low using both NMOS transistors 331 and 332, as shown in FIG. 3. Thus, compare circuit 330 enables CAM bit cell 1.01 to function as a conventional ternary CAM bit cell, but with all the performance advantages of a shorter length CAM bit cell due to its stacked architecture, as detailed above.

Figure 4:
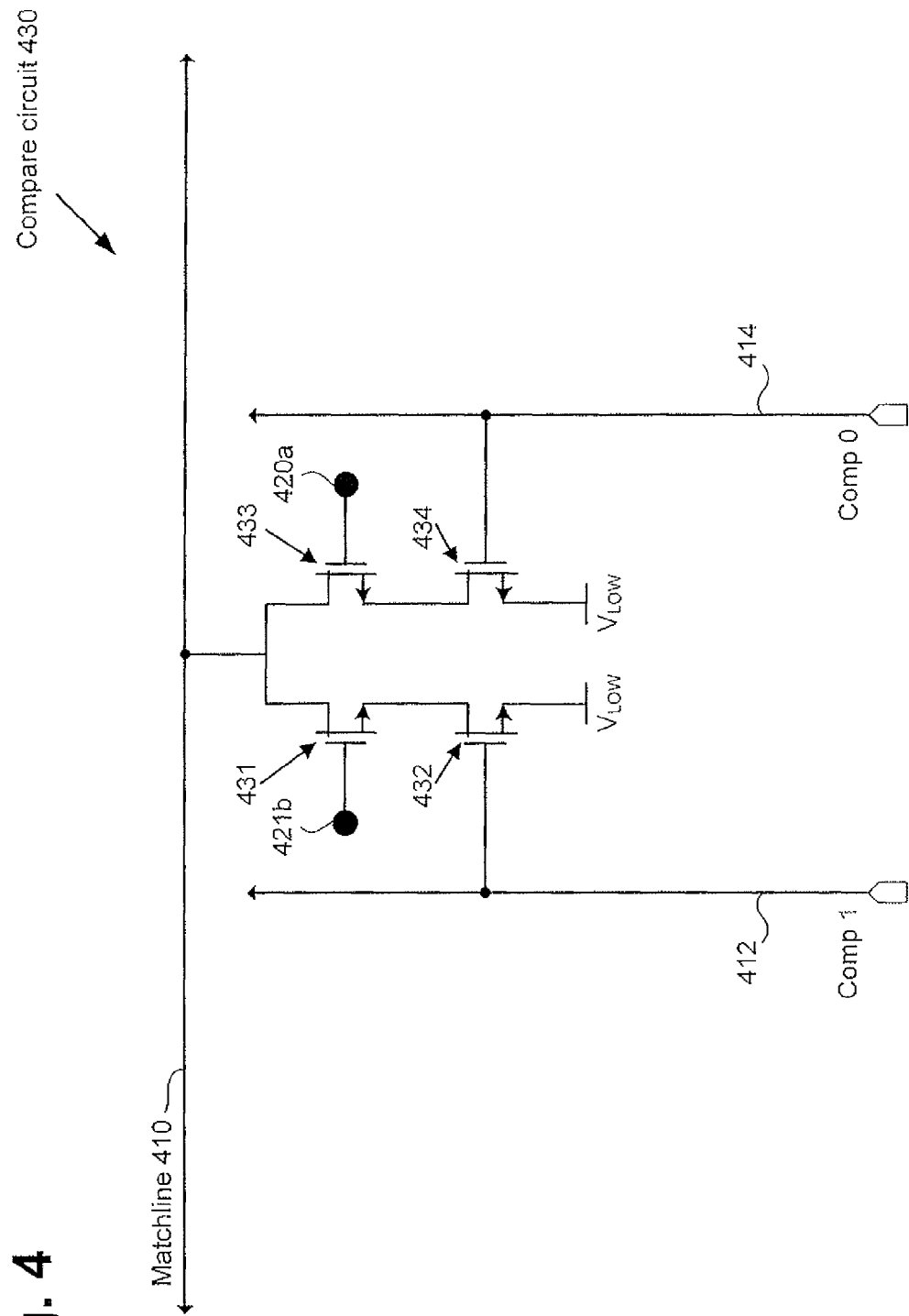
FIG. 4 illustrates an equivalent circuit schematic of a CAM compare circuit, according to another embodiment of the present invention.

FIG. 4 shows compare circuit 430 representing another embodiment of a compare circuit suitable for use in a CAM system according to the present inventive concepts. In FIG. 4, matchline 410, nodes 421b and 420a, compare lines 412 and 414, and compare circuit 430 correspond respectively to matchline 110, nodes 121b and 120a, compare lines 112 and 114, and compare circuit 130 of FIG. 1. Compare circuit 430 may include two pairs of NMOS transistors, e.g., NMOS transistor pair 431 and 432, and NMOS transistor pair 433 and 434, in two pulldown-stack configurations coupled to matchline 410 that substantially concurrently compare compare-data against stored data accessed through nodes 420a and 421b while applying a corresponding match or mismatch state to matchline 410, depending on an encoding of the stored data. For example, instead of having storage element 120 of FIG. 1 assigned a data bit and storage element 121 of FIG. 1 assigned a mask bit, as with compare circuit 330 above, storage elements 120 and 121 may be used in conjunction to store an encoding of a data bit and a mask bit.

In one possible configuration, an example encoding may be: (0,0)→(0,0), (0,1)→(1,1), (1,x)→(1,0) and (0,x)→(0,1), where the first coordinates are (mask, data) and the second coordinates are their encoding as stored in, for example, (storage element 21, storage element 120). In such encoding, "x" signifies an irrelevant state, where the encoding is the same regardless of the state of that bit. As can be seen from FIGS. 1 and 4, encoded state (1,0) may force a match state for compare circuit 430 regardless of the compare-data, and encoded state (0,1) may force a mismatch for compare circuit 430.

While such an encoding may require additional time and possibly dedicated encoding circuitry when writing data to CAM system 100, for example, because this possible performance degradation is limited to write performance, its impact on overall performance is relatively small, as explained above.

Compare circuit 430 complements the performance benefits of the stacked architecture of the present inventive concepts, and it offers many compare performance advantages over compare circuit 330. For example, compare circuit 430 may comprise two fewer transistors than compare circuit 330, and compare circuit 430 may comprise only one type of MOS transistor, e.g., all of transistors 431, 432, 433, and 434 are of the same conductivity type (N type). As is known in the art, mixing PMOS and NMOS transistor structures on a semiconductor chip requires enough on-chip space to form large P type or N type wells in order to house the transistors having conductivity type opposite that of the chip substrate, for example. Thus, because compare circuit 430 may comprise MOS transistors all of the same conductivity type, compare circuit 430 may comprise MOS transistors matching a particular substrate type and thereby significantly reduce an on-chip space required to fabricate compare circuit 430, as compared to, for example, compare circuit 330. Moreover, the reduction in number of transistors also reduces its on-chip space requirements as well as its overall fabrication cost. As such, compare circuit 430 may be fabricated much more compactly than, for example, compare circuit 330, thereby significantly reducing a length of CAM bit cell 101, with all the attendant performance benefits with respect to matchline metal load as outlined above.

In addition, however, compare circuit 430 also offers significant compare performance advantages with respect to the resistive and capacitive loads seen by compare lines 412 and 414 coupled to compare circuit 430. For example, as shown in FIG. 1, compare circuit 430 may be coupled to compare lines 412 and 414 exclusively through the gates of NMOS transistors 432 and 434. By contrast, compare circuit 330 of FIG. 3 may be coupled to compare lines 312 and 314 through the source/drain paths of NMOS transistors 335 and 336 and PMOS transistors 337 and 338, as well as through the gate of NMOS transistor 331. Thus, compare lines 312 and 314 coupled to compare circuit 330 as shown in FIG. 3 may be subject to significantly increased resistive and capacitive loads as compared to compare lines 412 and 414 coupled to compare circuit 430 of FIG. 4.

As a result, compare lines 412 and 414 coupled to compare circuit 430 may operate at a significantly higher speed and may consume significantly less power during a compare operation than compare lines 312 and 314 coupled to compare circuit 330. As such, the beneficial arrangement of compare circuit 430 may offer a net increase in the performance of compare lines 412 and 414 even when taking into account their increased metal load due to an increased height of CAM system 100, relative to a conventional CAM system. By increasing a net performance of compare lines 412 and 414, relative to compare lines 312 and 314 of compare circuit 330, as well as to conventional CAM system architectures, compare circuit 430 improves a compare performance and thus further improves an overall performance of CAM system 100, both in terms of speed and power consumption.

One perceived drawback to compare circuit 430 may be the addition of another source/drain load to matchline 410. For example, instead of a single source/drain load of NMOS transistor 331 in compare circuit 330, matchline 410 may see the source/drain loads of both NMOS transistors 431 and 433. However, any increase in the resistive and capacitive loads of matchline 410 because of the additional source/drain load of compare circuit 430 is typically much smaller than the decrease in metal load due to the compact nature of compare circuit 430 and the concomitant reduction in length of CAM bit cell 101. Thus, as with the net performance improvement of its coupled compare lines 412 and 414, compare circuit 430 improves a net performance of matchline 410, relative to compare circuit 330 as well as to conventional CAM system architectures, and so improves a compare performance and thus further improves an overall performance of CAM system 100, both in terms of speed and power consumption.

Thus, embodiments of the present invention provide reduced CAM system power consumption and increased CAM system speed. In particular, the present invention provides a CAM system architecture for increasing CAM system performance by providing a compact CAM bit cell including stacked storage elements and a compare circuit arranged primarily to reduce a length of a coupled matchline. A shorter matchline typically equates to a faster CAM system that consumes less power, as explained above. Such a CAM system allows CAM-based devices to be manufactured less expensively by reducing fabrication costs associated with dedicated power supply circuitry, which would increase their use and utility in a variety of high speed and low-power applications.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A content-addressable memory (CAM) comprising:
 a plurality of bit cells in a stacked architecture, each of said plurality of bit cells including:
 a pair of stacked storage elements situated in a first column;
 a compare circuit coupled to said pair of stacked storage elements and a matchline of said CAM, said compare circuit situated in a second column;
 said pair of stacked storage elements sharing bit lines.

2. The CAM of claim 1, wherein said first column adjoins said second column.

3. The CAM of claim 1, wherein said compare circuit is implemented using a plurality of transistors of a same conductivity type.

4. The CAM of claim 1, wherein said compare circuit comprises a plurality of transistors arranged in pulldown-stack configurations coupled to said matchline.

5. The CAM of claim 1, wherein said compare circuit is further configured to compare data stored in one of said pair of stacked storage elements against compare-data supplied by compare lines of said CAM and then apply a match or mismatch state to said matchline.

6. The CAM of claim 1, wherein said compare circuit is further configured to compare compare-data supplied by compare lines of said CAM against data stored in one of said pair of stacked storage elements while concurrently applying a match or mismatch state to said matchline.

7. A content-addressable memory (CAM) comprising:
 a plurality of bit cells in a stacked architecture, each of said plurality of bit cells including:
  a pair of stacked storage elements situated in a first column;
  a compare circuit coupled to said pair of stacked storage elements and a matchline of said CAM, said compare circuit situated in a second column;
 said pair of stacked storage elements being coupled to separate bit lines.

8. The CAM of claim 7, wherein said first column adjoins said second column.

9. The CAM of claim 7, wherein said compare circuit is implemented using a plurality of transistors of a same conductivity type.

10. The CAM of claim 7, wherein said compare circuit comprises a plurality of transistors arranged in pulldown-stack configurations coupled to said matchline.

11. The CAM of claim 7, wherein said compare circuit is further configured to compare data stored in one of said pair of stacked storage elements against compare-data supplied by compare lines of said CAM and then apply a match or mismatch state to said matchline.

12. The CAM of claim 7, wherein said compare circuit is further configured to compare compare-data supplied by compare lines of said CAM against data stored in one of said pair of stacked storage elements while concurrently applying a match or mismatch state to said matchline.

13. A content-addressable memory (CAM) bit cell comprising:
 a pair of stacked storage elements situated in a first column;
 a compare circuit coupled to said pair of stacked storage elements and configured to couple to a matchline, said compare circuit situated in a second column, and wherein said compare circuit comprises a plurality of transistors of a same conductivity type;
 said pair of stacked storage elements sharing bit lines.

14. The CAM bit cell of claim 13, wherein said first column adjoins said second column.

15. The CAM bit cell of claim 13, wherein said compare circuit is implemented using a plurality of transistors of a same conductivity type.

16. The CAM bit cell of claim 13, wherein said compare circuit is further configured to couple to compare lines through compare circuit transistors.

17. The CAM bit cell of claim 13, wherein said compare circuit comprises a plurality of transistors arranged in pull-down-stack configurations coupled to said matchline.

18. The CAM bit cell of claim 13, wherein said compare circuit is further configured to compare data stored in one of said pair of stacked storage elements against compare-data supplied by compare lines and then apply a match or mismatch state to said matchline.

19. The CAM bit cell of claim 13, wherein said compare circuit is further configured to compare compare-data supplied by compare lines against data stored in one of said pair of stacked storage elements while concurrently applying a match or mismatch state to said matchline.

* * * * *